(12) United States Patent
Foti

(10) Patent No.: US 7,817,630 B2
(45) Date of Patent: Oct. 19, 2010

(54) METHOD, COMMUNICATIONS NODE, AND MEMORY FOR DYNAMIC DICTIONARY UPDATING AND OPTIMIZATION FOR COMPRESSION AND DECOMPRESSION OF MESSAGES

(75) Inventor: George Foti, Dollard des Ormeaux (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 450 days.

(21) Appl. No.: 11/611,980

(22) Filed: Dec. 18, 2006

(65) Prior Publication Data

US 2008/0147801 A1     Jun. 19, 2008

(51) Int. Cl.
*H04L 12/28*     (2006.01)
(52) U.S. Cl. ...................................... 370/389; 709/230
(58) Field of Classification Search .................. 370/389, 370/352; 709/230
See application file for complete search history.

(56) References Cited

U.S. PATENT DOCUMENTS

| 4,876,541 | A | | 10/1989 | Storer |
| 5,949,961 | A | * | 9/1999 | Sharman ..................... 704/260 |
| 6,750,791 | B1 | * | 6/2004 | Liu ............................. 341/87 |
| 2003/0037077 | A1 | * | 2/2003 | Brill et al. ................... 707/533 |
| 2003/0233478 | A1 | | 12/2003 | Chuah et al. |
| 2004/0114577 | A1 | * | 6/2004 | Sojka et al. .................. 370/352 |
| 2005/0185677 | A1 | | 8/2005 | Christoffersson et al. |
| 2006/0129689 | A1 | * | 6/2006 | Ho et al. ...................... 709/230 |

FOREIGN PATENT DOCUMENTS

| WO | 98/06028 A1 | 2/1998 |
| WO | 2005/011175 A2 | 2/2005 |

OTHER PUBLICATIONS

M. Garcia-Martin et al., The Session Initiation Protocol (SIP) and Session Description Protocol (SDP) Static Dictionary for Signaling Compression (SigComp), Network Working Group, RFC 3485, Feb. 2003.

(Continued)

*Primary Examiner*—Dang T Ton
*Assistant Examiner*—Wei Zhao
(74) *Attorney, Agent, or Firm*—Dilip C. Andrade; Ericsson Canada Inc.

(57) ABSTRACT

A method, communications node, and memory for updating and respectively storing a dynamic dictionary for use in text-based protocol message compression/decompression. A message is received by the compression/decompression module from a local client module or from another's node, and the compression/decompression module determines if sequences from the received message match sequences from a dictionary, then determines if any matching sequences are successive in the message. If so, the compression module concatenates the matching successive sequences from the message and copies the resulting combined expression into a dynamic dictionary, thus creating a longer expression to be used in subsequent message compression and decompression. The compression module uses real traffic messages and creates longer string expressions. In one variant, the matching sequences comprise one or more string expressions constituted of one or more data bytes and the invention first detects message's individual expressions matching individual expressions from the dictionary.

24 Claims, 6 Drawing Sheets

OTHER PUBLICATIONS

R. Price et al., Signaling Compression (SigComp), Network Working Group, RFC 3320, Jan. 2003.

H. Hannu et al., Signaling Compression (SigComp)—Extended Operations, Network Working Group, RFC 3321, Jan. 2003.

P. Deutsch, Deflate Compressed Data Format Specification version 1.3, Network Working Group, RFC 1951, May 1996.

J. Jason et al., IPsec Configuration Policy Information Model, Network Working Group, RFC 3585, Aug. 2003.

J. Rosenberg et al., SIP : Session Initiation Protocol, Network Working Group, RFC 3261, Jun. 2002.

International Search Report from corresponding PCT application PCT/IB2007/054774.

* cited by examiner

METHOD, COMMUNICATIONS NODE, AND MEMORY FOR DYNAMIC DICTIONARY UPDATING AND OPTIMIZATION FOR COMPRESSION AND DECOMPRESSION OF MESSAGES

TECHNICAL FIELD

The present invention relates to a method and system for dynamic dictionary optimization for use in compression and decompression of messages.

BACKGROUND

The Session Initiation Protocol (SIP) is an Internet Engineering Task Force (IETF) standard protocol for initiating an interactive user session that may involve multimedia elements such as video, voice, chat, gaming, and virtual reality. Like the Hypertext Transfer Protocol (HTTP) or the Simple Mail Transfer Protocol (SMTP), SIP works in the application layer of the Open Systems Interconnection (OSI) communications model and can establish multimedia sessions or Internet telephony calls, modify, and terminate them. SIP can also be used to invite participants to unicast or multicast sessions that do not necessarily involve the initiator. Because SIP supports name mapping and redirecting services, it makes it possible for users to initiate and receive communications and services from various locations, and for networks to identify the users wherever they are. SIP is a request-response protocol, dealing with requests from clients and responses from servers. Participants are identified by SIP Uniform Resource Locators (URLs). SIP Requests can be sent through any transport protocol, such as for example the User Datagram Protocol (UDP), the Stream Control Transmission Protocol (SCTP), or the Transport Control Protocol (TCP). SIP determines the end system to be used for the session, the communication media and media parameters, and the called party's desire to engage in the communication. Once these are assured, SIP establishes call parameters at either end of the communication, and handles the call transfer and termination. SIP is specified in IETF's Request for Comments (RFC) 3261, which is herein included by reference in its entirety.

SIP has emerged as the protocol of choice for handling session setup in the IP Multimedia Subsystem (IMS).

Being employed for most session setup scenarios in IMS, it has been noticed that SIP is characterized by large message sizes, which results in increased processing demands on the nodes (e.g. terminals and servers) involved in the SIP sessions. For example, typical SIP messages range from a few hundred bytes up to a few thousand bytes (in certain occasions). With the planned usage of SIP protocol in wireless handsets, as part of 2.5G and 3G cellular networks, where over-the-air bandwidth is scarce and call set-up time is critical, large message size becomes a problem.

A partial solution to this drawback was provided by the use of SigComp (Signalling Compression). RFCs 3320 and 3321, which are also included herein in their entirety, specify a protocol on the IETF standards track that may be used to compress text-based application layer protocols such as SIP. SigComp enables compression and decompression of messages sent across networks, which may have stringent bandwidth restrictions. SigComp may interface with the three main transport layer protocols, namely TCP (Transport Control Protocol), UDP and SCTP. One of the main drivers for the development of SigComp is precisely its planned usage of text-based protocols like SIP in wireless handsets as part of 2.5G and 3G cellular networks. In such networks, the large SIP message size coupled with relatively low data rates across the radio interface results in significant transmission delays. SigComp provides a means to reduce this problem by offering robust, lossless compression of application messages. In SIP, SigComp is invoked and negotiated between the parties involved in the session (e.g. terminals and/or servers). A client may initiate the compression mechanism by requesting the use of SigComp through the inclusion of the extension header "comp=sigcomp" in the request message. SigComp implements a decompression virtual machine, which allows applications to dynamically select the compression algorithm of their choice. Thus, SigComp allows two peers to perform compression/decompression using any compression technique, provided that the decompressor is provided with the byte code (logic) needed to perform the decompression to recover the original message. This flexibility is achieved by virtue of the fact that the byte code for carrying on the decompression is transferred within the SigComp messages, hence allowing the originating party to practically choose any compression algorithm it sees fit, without causing any inter-working problems.

Upon establishment of a session with SigComp, a node (e.g. a terminal) sends a first message along with the byte code, which is binary program; this program indicates to the receiving terminal how it can decompress the compressed message using a SIP dictionary. The IETF's RFC 3485, also included herein in its entirety, specifies a standard SIP dictionary. When sending a message, the SIP message content is compared with the SIP dictionary. If a match is found between a text string of the message and one of the dictionary, the message as sent does not include that string, but instead comprises a start address where, in the dictionary, the receiver can find the missing text string. The length of the string is also included so that the receiver terminal can recompose the compressed message using its own identical copy of the dictionary.

Reference is now made to FIG. 1 (Prior Art), which is high level representation of a SIP static dictionary 100. Such a static dictionary stores string (text) expressions $E_1$-$E_n$ $102_i$ typically used in SIP messages. In many implementations, the text string content of the SIP dictionary 100 is not separated into individual expressions as such, with defined limits or borders, but is rather a contiguous text string, e.g. of the type $E_1E_2E_3 \ldots E_n$, which comprises of different contiguous text expressions. Some or all of these expressions $E_i$ $102_i$ or parts of the contiguous text string may include complete SIP messages as well. They are used for replacing strings which are part of transmitted SIP messages, or SIP messages in their entirety, thus reducing the size of the transmitted message (compressing the message). Typically, the size and number of expressions $E_i$ is limited by the size of the memory allocated to the dictionary in a given node, particularly when such a node is a mobile terminal. The SIP dictionary 100 is said to be static because its content is provided before, or at the beginning of a given SIP session, and is not further altered during said session.

Reference is now made to FIG. 2 (Prior Art), which is a high level representation of a dictionary index 200. When an expression of a given SIP message is detected to match an expression $E_i$ of the dictionary, that expression of the SIP message is replaced by the dictionary index 200 pointing to the expression found within the dictionary. As the index size is much smaller than the replaced expression, the size of the transmitted message is reduced, thus compressing the message. The index 200 may comprise the location 202 of the expression in the dictionary 100, and the expression length 204, thus providing sufficient information to the receiver side to retrieve the expression from its own identical copy of the dictionary 100, so that the receiver can reconstruct the original message (decompression).

Reference is now further made to FIG. 3 (Prior Art), which is a high level nodal operation and signal flow diagram of a SigComp compression/decompression scheme using a SIP static dictionary 100. Shown in FIG. 3 is a sender 302 (e.g. a terminal or a server) and a receiver 304 (e.g. another terminal or a server), each one having a SigComp module 306 and 308 respectively and copies of the same static SIP dictionary 100. When the sender 302 sends a compressed message to the receiver 304 using SigComp for the first time, it compresses the message using its static dictionary 100, action 305. Part of action 305, the SigComp module takes expressions $E_i$ from the dictionary 100, and using these expressions, attempts to match parts of the message that is be compressed. The matched parts of the message are replaced within the message with the dictionary index of the dictionary's matching expressions. In many implementations, the individual expressions $E_i$ of the dictionary are data bytes, so that the comparisons between the expressions $E_i$ and the message parts are performed byte by byte. Then, the sender 302 sends the compressed message 310 via its SigComp module 306, the message including the index 309 required for decompression along with the byte code 311 to be used also for decompression by the receiver 304. The later, upon receipt of the compressed message 310, stores the byte code, action 312, and then uses the byte code along with the index 309 for decompressing the message 310, i.e. for retrieving from its own static dictionary 100 the missing expressions of the message, thus reconstituting the original message. The receiver 304 then confirms the safe receipt of message 310 via a message confirm action 314. Upon receipt of message 314, the sender 302 implicitly deducts that the byte code 311 was successfully received by receiver 304. Then the sender 302 may send compressed messages as described without again sending the byte code 311, but rather only including the new index required for decompression of subsequent messages. For example, the sender 302 may compress a second message 316, and transmit the compressed message 316, to the receiver 304, using its SigComp module 306. For this purpose, the sender's SigComp module 306 uses the dictionary 100 to again replace any expressions of the message 316 found to match expressions from the dictionary 100 with corresponding expression indexes 309' as described hereinbefore, action 315. The message 316 is then sent to the receiver 304 which, upon receipt of the compressed message, uses again its own SigComp module 308 to decompress the message, action 318, by retrieving from its own copy of the dictionary 100 the expressions that correspond to the indexes 309' contained in the message 316, thus reconstructing the original message.

Due to the heavy signaling involved in SIP, 3GPP (the $3^{rd}$ Generation Partnership Project) IMS Release 5 standards mandates SigComp (Signaling Compression) as the compression/decompression protocol of choice for IMS. SIG-COMP stacks can be used in 3G user terminals and all types of Call State Control Functions (CSCFs.)

The major components of SigComp are:

Compressor is the component that compresses the messages and uploads the byte code for the corresponding decompression algorithm to the decompressor as part of the SigComp message.

Decompressor (also called Universal Decompressor Virtual Machine, UDVM) provides a mechanism to uncompress messages by interpreting the corresponding byte code. The UDVM can be used to decompress the output of various compressors such as DEFLATE (defined in the IETF's RFC-1951).

State Handler retains information between received Sig-Comp messages and thus, eliminates the need to send decompression instructions with each of the compressed message.

SigComp is agnostic of compression algorithms, supports state handling for better compression ratio, is pluggable with any protocol stack and provides APIs (Application programming Interface) for easy integration with any application.

Besides static SIP dictionary defined in the IETF's RFC 3485, SigComp can also use dynamic SIP dictionaries, which instead of being pre-defined as the static SIP dictionaries, they are rather updated during an ongoing session each time a message is successfully decompressed. In such instances, the entire decompressed SIP message is copied in the dynamic dictionary in a round-robin manner, i.e. replacing the oldest message of the dictionary. In this manner, most recent decompressed messages are kept in the dictionary to serve as a basis for subsequent compression/decompressions.

However, it has been proven through field trials that the current SigComp specifications have several shortcomings, which result in compression ratios that are significantly less that what has been anticipated. For example, for some time sensitive application services such as Push-To-Talk (PTT), the latencies resulting from the poor ratios achieved for message compression were unacceptable.

Hypothesis to explain the reasons why the current Sig-Comp specifications are not optimal are as follows:

Dynamic compression does not always work with non-reliable transport medium. This is due to the limited memory storage in end-user devices and the limitations of this memory (size of memory) by the SigComp specification for storing entire SIP messages. In many devices, it is impossible to simultaneously store more than 2 entire SIP message. Since SIP messages can get out of order because of the use of UDP, decompression failure occurs, as the state against which decompression should be performed for a disordered (out-of-sequence) message had to be released due to shortage of memory. Eliminating this problem in its entirety is costly, both in terms of performance and efficiency. The root problem is that the dynamic compression is based on stateful compression, which does not work well with non-reliable transports in combination with limited terminal memory for storing SIP messages. This situation thus leads to messages that are required for the decompression to be prematurely released, due to memory limitations. Therefore, data against which compression/decompression is taking place is constantly overwritten in a round robin fashion. While the overwriting was deemed useful in improving compression according to the SigComp specification, the assumption that by using current traffic information to compress future message would yield a better performance proved to be faulty, as it misses some key facts: the above is true only for a monolithic protocol, which is not the case for SIP, which includes various extensions for a variety of SIP-based services that are unrelated to the establishment of multimedia sessions, such as for example the presence service. Thus, in SIP, the current traffic is rarely an indication of the future traffic.

Conclusively, there is no predictability when it comes to compression performance, when dynamic compression (based on the IETF's RFCs 3485, 3220, or 3321) is used with SigComp, since it very much depends on the traffic type, and such compression performance cannot be optimized for a live applications such as PTT, where latency to set up the session is the key performance indicator.

Although a thorough search has revealed no relevant prior art for the present invention, the international publication WO 2005/011175 bears some relation with the field of the present invention. This publication teaches a system and method for compressing and compressing SIP messages using a tokenized binary protocol. Tokens represent message elements of internal data structures defining SIP messages. Such tokens may be assigned to message elements based on various design requirements. According to this publication, various kinds of dictionaries may be used such as for example static dictionaries which are never transmitted, or dynamic message dictionaries containing strings found only in specific messages. Furthermore, local dictionaries may contain additional text strings which are specific to a particular domain, or to a particular device. However, the international publication WO 2005/011175 stops short of suggesting creation of dictionaries as the one described in the present invention.

The US patent application publication US2003/0233478 also bears some relation with the field of the present invention. This publication teaches a protocol message compression scheme for wireless communications system, wherein text messages are compressed for transmission. The method includes parsing text strings and encoding numerical values with a binary representation, analyzing the values of the text strings and populating a session specific codebook, which is initialized to empty, with partial strings from the values. This process is achieved as messages are processed for transmission, during real traffic. The method of compressing the message for transmission may also include parsing the message with a template and generating at least one substrings to be transmitted; parsing the at least one substring with entries in a session specific codebook and generating the first part of the compressed message; populating the session specific codebook with entries from unknown field values; parsing any unmatched substring with entries from a first static dictionary and generating a second part of the compressed message; parsing any still unmatched substring with entries from a second static dictionary and generating the third part; and combining the first part, the second part, and the third part of the compressed message for transmission. Nevertheless, the US patent application publication US2003/0233478 also stops short of suggesting the creation of dictionaries as the one described in the present invention.

SUMMARY

Accordingly, it should be readily appreciated that in order to overcome the deficiencies and shortcomings of the existing solutions, it would be advantageous to have a method and communications node for dynamic dictionary update and optimization for use in compressing and decompressing of messages.

The present invention provides such a method and system.

According to the present invention, there are provided a method, communications node, and memory for updating and respectively storing a dynamic dictionary for use in text-based protocol message compression/decompression. According to the invention, a message is received by a compression/decompression module from a client module of a communications node, or from another's node client module, and the compression/decompression module determines if sequences from the received message match sequences from a dictionary, then determines if any matching sequences are successive in the message. If so, the compression module concatenates the matching successive sequences from the message and copies the resulting combined expression into a dynamic dictionary, thus creating a longer expression to be used in subsequent message compression and decompression. The compression module uses real traffic messages and creates longer string expressions. In one variant, the matching sequences comprise one or more string expressions constituted of one or more data bytes and the invention first detects message's individual expressions matching individual expressions from the dictionary.

In one aspect, the present invention is a method for updating a dynamic dictionary for use in compressions and decompression of messages, the method comprising the steps of:

a. receiving a message;

b. determining one or more matching sequences contained in the message that each have a corresponding match in a first dictionary;

c. determining which matching sequences are contiguous to each other in the message; and d. creating in the dynamic dictionary at least one new combined expression comprising two or more matching sequences determined to be contiguous to each other within the message.

In another aspect, the invention is a communications node comprising:

a first dictionary containing string expressions for use in message compression and decompression;

a dynamic dictionary adapted to store expressions for use in message compression and decompression; and a compression/decompression module adapted to receive a message, the compression/decompression module being further adapted to determine one or more matching sequences contained in the message that each have a corresponding match in the first dictionary, and being yet further adapted to determine which matching sequences are contiguous to each other in the message, and to create in the dynamic dictionary at least one new combined expression comprising two or more matching sequences determined to be contiguous to each other within the message.

In yet another aspect, the invention is a memory for storing a dictionary for use in message compression and decompression, the memory comprising:

a first dictionary comprising string expressions for use in message compression/decompression; and a dynamic dictionary comprising at least one combined expression comprising two or more sequences determined to be contiguous to each other within a message received by a communications node that includes the memory, each one of the two or more matching sequences having been determined to have a corresponding match in a first dictionary.

BRIEF DESCRIPTION OF THE DRAWINGS

For a more detailed understanding of the invention, for further objects and advantages thereof, reference can now be made to the following description, taken in conjunction with the accompanying drawings, in which:

FIG. 5.*a* is an exemplary flowchart diagram representative of a method for updating a dynamic dictionary according to the preferred embodiment of the present invention;

DETAILED DESCRIPTION

Figure 1:
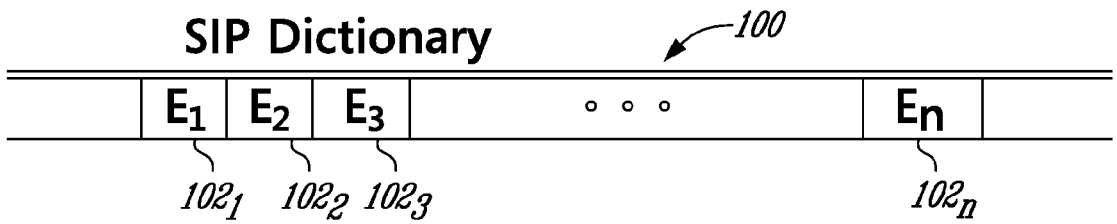
FIG. 1 (Prior Art) is high level representation of a SIP dictionary.
Figure 2:
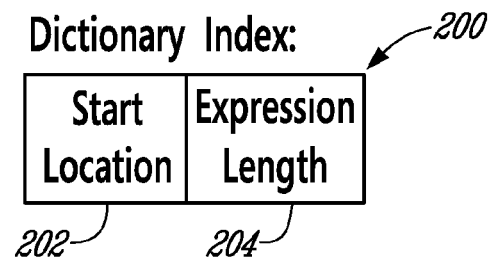
FIG. 2 (Prior Art) is a high level representation of a dictionary index.
Figure 3:
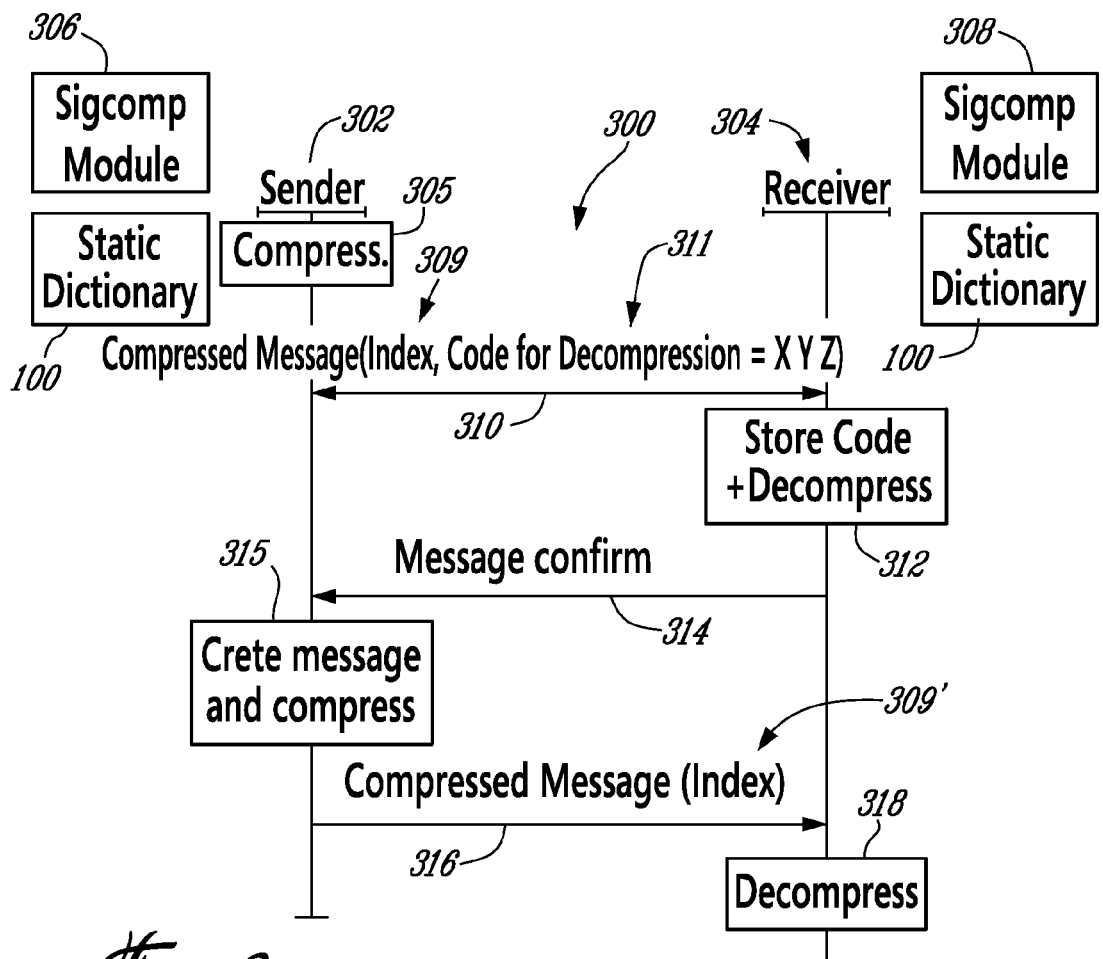
FIG. 3 (Prior Art) is a nodal operation and signal flow diagram of SigComp compression/decompression scheme using a SIP static dictionary.

The innovative teachings of the present invention will be described with particular reference to various exemplary embodiments. However, it should be understood that this class of embodiments provides only a few examples of the many advantageous uses of the innovative teachings of the invention. In general, statements made in the specification of the present application do not necessarily limit any of the various claimed aspects of the present invention. Moreover, some statements may apply to some inventive features but not to others. In the drawings, like or similar elements are designated with identical reference numerals throughout the several views.

The present invention provides methods and a communications node for the creation and use of an optimized dynamic dictionary for compression and decompression of messages related to specific applications.

Figure 4:
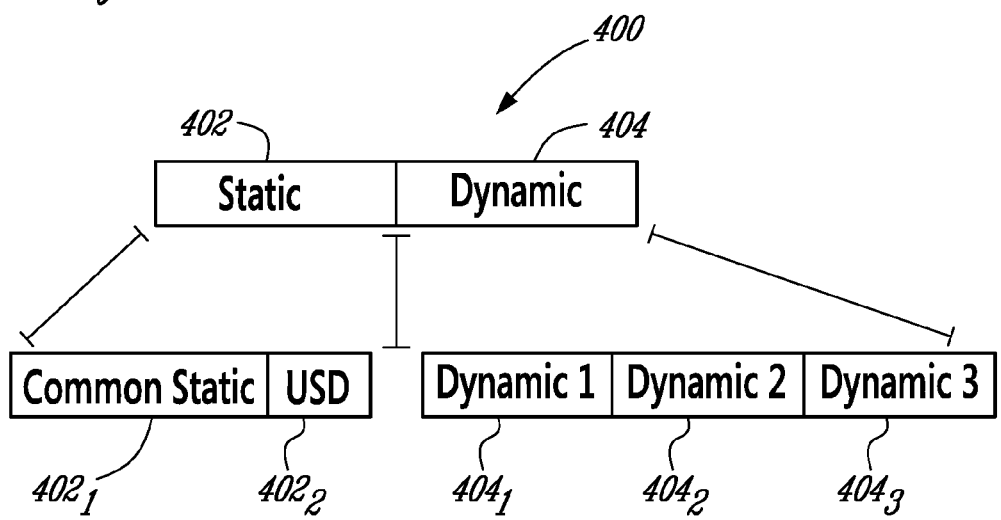
FIG. 4 is an exemplary representation of a dictionary according to the preferred embodiment of the present invention.

Reference is now made to FIG. 4, which is an exemplary representation of a dictionary 400 for use in compression and decompression of text-based protocol messages, according to the preferred embodiment of the present invention. The dictionary 400 may be used according to the present invention, for example, in compression/decompression modules (e.g. SigComp modules) that compress and decompress text-based messages. The dictionary 400 comprises a static dictionary 402 which typically contains expressions that are likely to be encountered in messages of a given protocol. Such expressions may have the form of one or more data bytes in the dictionary 400. Generally speaking, the term expression should be understood herein as encompassing any type of string, textual or not, including but being not limited to one or more data bytes, text strings, etc. The particularity of the static dictionary 402 is that it is created before the session where it is actually used for compression and decompression of the messages, and is no longer changed once the session is ongoing. In certain implementations, the static SIP dictionary 402 may be permanent and specific to a given user or terminal. For example, if the dictionary 400 is a SIP dictionary, the static dictionary 402 contains string expressions of SIP messages (or even entire SIP messages) that are likely to be used by a certain user, and may comprise expressions associated to the user. In certain implementations, the static dictionary 402 may comprise a common static part $402_1$ which is common to one or more users and to all sessions of a given protocol carried on by a given node, and/or a User Specific Dictionary (USD) part $402_2$, which may be specific to a certain user, or to a certain user and to a certain session, and may thus contain message expressions (or even entire messages) that are specific to the certain user, or to the certain user and to the certain session. The construction of the USD part $402_2$ is detailed and explained in the co-invented, co-owned and co-pending US patent application entitled "Method and Communications Node for Creation and Transmission of User Specific Dictionary for Compression and Decompression of Messages", filed on Jun. 30, 2006, Ser. No. 11/477,638, which is herein included by reference in its entirety.

For example, the static dictionary 402 may be a SIP static dictionary, comprising i) a common static part $402_1$ including SIP messages expressions used by several users of a given terminal node for carrying on SIP sessions, and ii) a USD part $402_2$ including SIP expressions specific to a certain user and to a certain SIP session.

The dictionary 400 further comprises a dynamic dictionary 404 comprising one or more parts $404_i$, which may each be specific to a given protocol or session. According to the present invention, the content of the dynamic dictionary 404 is created and/or updated during real traffic, such as for example when the user terminal is carrying on an actual communication and when compression and decompression of the messages exchanged by the parties are being performed. As a sending party issues a message, and that message is to be compressed, the compression module of the sending party determines if any two or more dictionary expressions, when concatenated, match any message expression. When a match is found, the invention populates the dynamic dictionary 404 with the matching combined expression. By inserting the matching combined expression in the dictionary 400, the compression module insures that the combined expression can be used for compression of subsequent messages, and this subsequent use would allow for a more efficient compression as the newly inserted combined expression has a greater length than the original individual expressions (since it is a combination of concatenated individual expressions).

Figure 6:
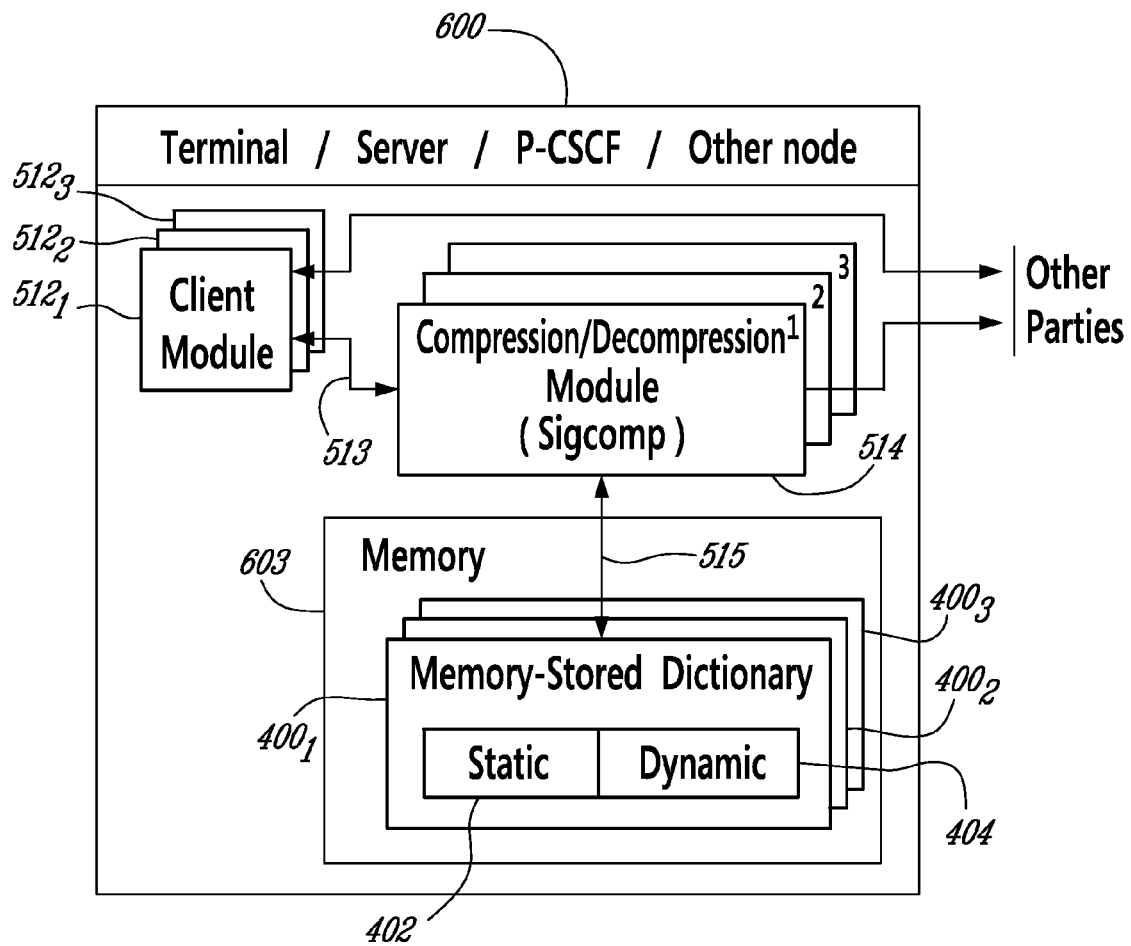
FIG. 6 is an exemplary high-level block diagram representative of a node implementing the preferred embodiment of the present invention.

Reference is now made to FIG. 6, which is an exemplary high-level block diagram representative of a node 600 implementing the preferred embodiment of the present invention. The node 600 may comprise, or consist of, a terminal, a server, a P-CSCF (or any other type of CSCF), or any other type of node that may communicate using message compression such as for example SigComp. The node 600 comprises a client application module 512 which is responsible for establishing a certain type of communication with other parties, such as for example with other terminals, servers, or CSCFs. The client application module may be, for example, a Push-To-Talk (PTT) client, a video-conferencing client, a Voice-over-IP (VoIP) client, or any other type of client. The node 600 further comprises a compression/decompression module 514, such as for example a SigComp module, which is responsible for the compression and decompression of messages issued by and respectively destined to the client application module 512. The client application module 512 is connected to the SigComp module 514 via appropriate interfaces or APIs 513, which may contain additional service logic for insuring proper communication therebetween. Finally, the node 600 comprises a compression/decompression dictionary 400, such as for example a SigComp dictionary, as the one described in relation to FIG. 4, which is stored in a memory 603. The later may be any type of memory, such as for example a hard-disk drive, a Random-Access Memory (RAM), etc, and connects to the compressions/decompression module 514 via appropriate interface and/or APIs 515. The node 600 functions for supporting communications wherein messages sent are compressed, and messages received are decompressed, using the compression/decompression module 514 in combination with the dictionary 400, in a manner which is yet to be described.

In a variant of the preferred embodiment of the invention, also illustrated in FIG. 6, the node 600 may run multiple client applications modules (also called clients) $512_i$, such as for example a VoIP client $512_1$, a PTT application client $512_2$, and a file transfer application client $512_3$. In such a configuration, each one of the clients $512_i$ may have a corresponding dictionary $400_i$. One or more compression/decompression modules 514 (e.g. SigComp modules) may perform the compression and decompression related actions on behalf of the clients, using the proper dictionary $400_i$ that corresponds to each one of the clients. For example, in a first possible implementation, only one compression/decompression module 514 is present and performs the compression and decompression related actions on behalf of all application clients $512_i$. In such an instance, the interfaces and/or APIs 513 and 515 contain proper application destination layer functionalities in order to properly route messages between the client modules $512_i$, the unique compression/decompression module 514 and the multiple dictionaries $400_i$. In a second possible implementation, there is one compression/decompression module $514_i$ for each application client $512_i$, which each has its own corresponding dictionary $400_i$.

Figure 5:
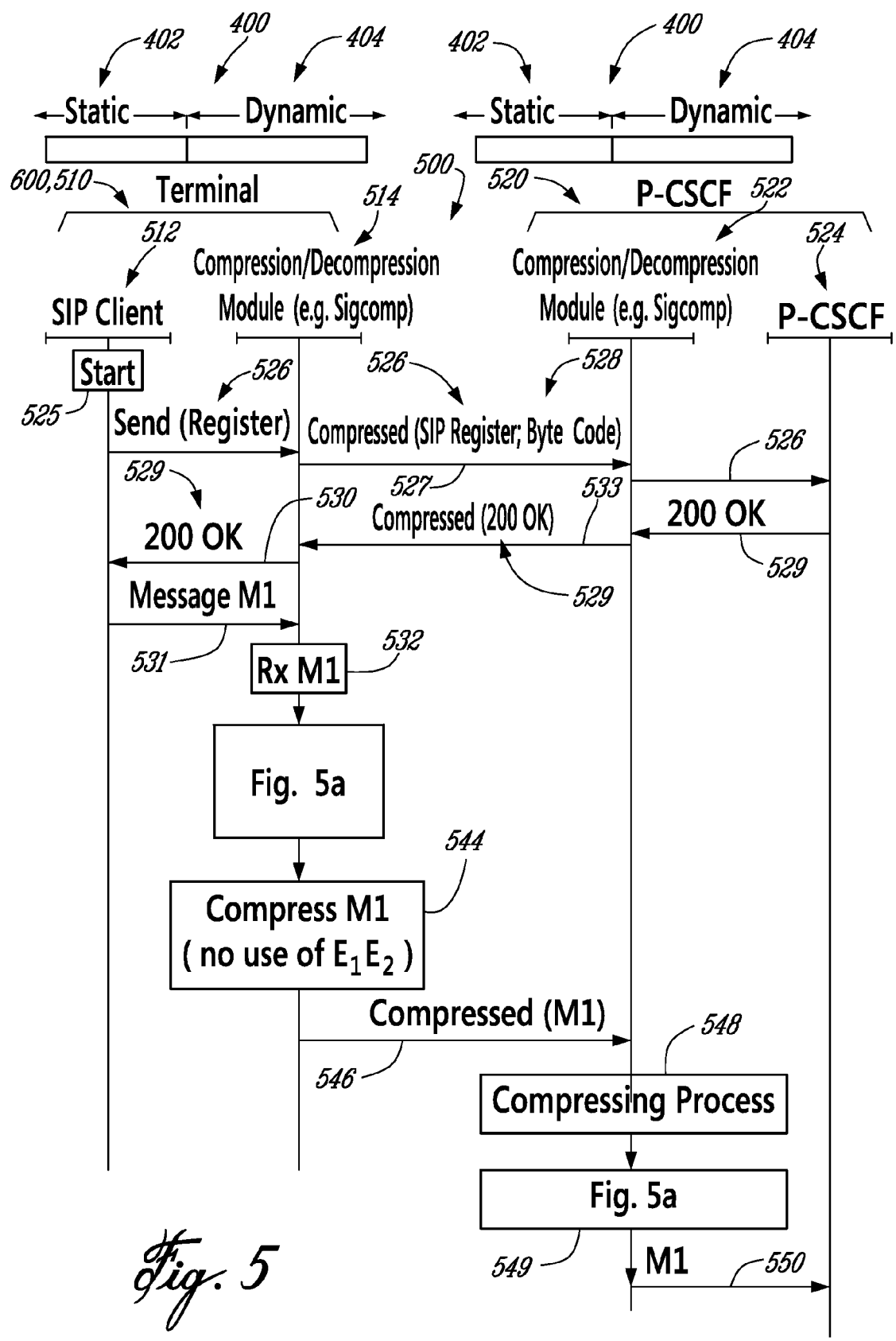
FIG. 5 is an exemplary nodal operation and signal flow diagram representative of a telecommunications network implementing the preferred embodiment of the present invention.
Figure 5A:
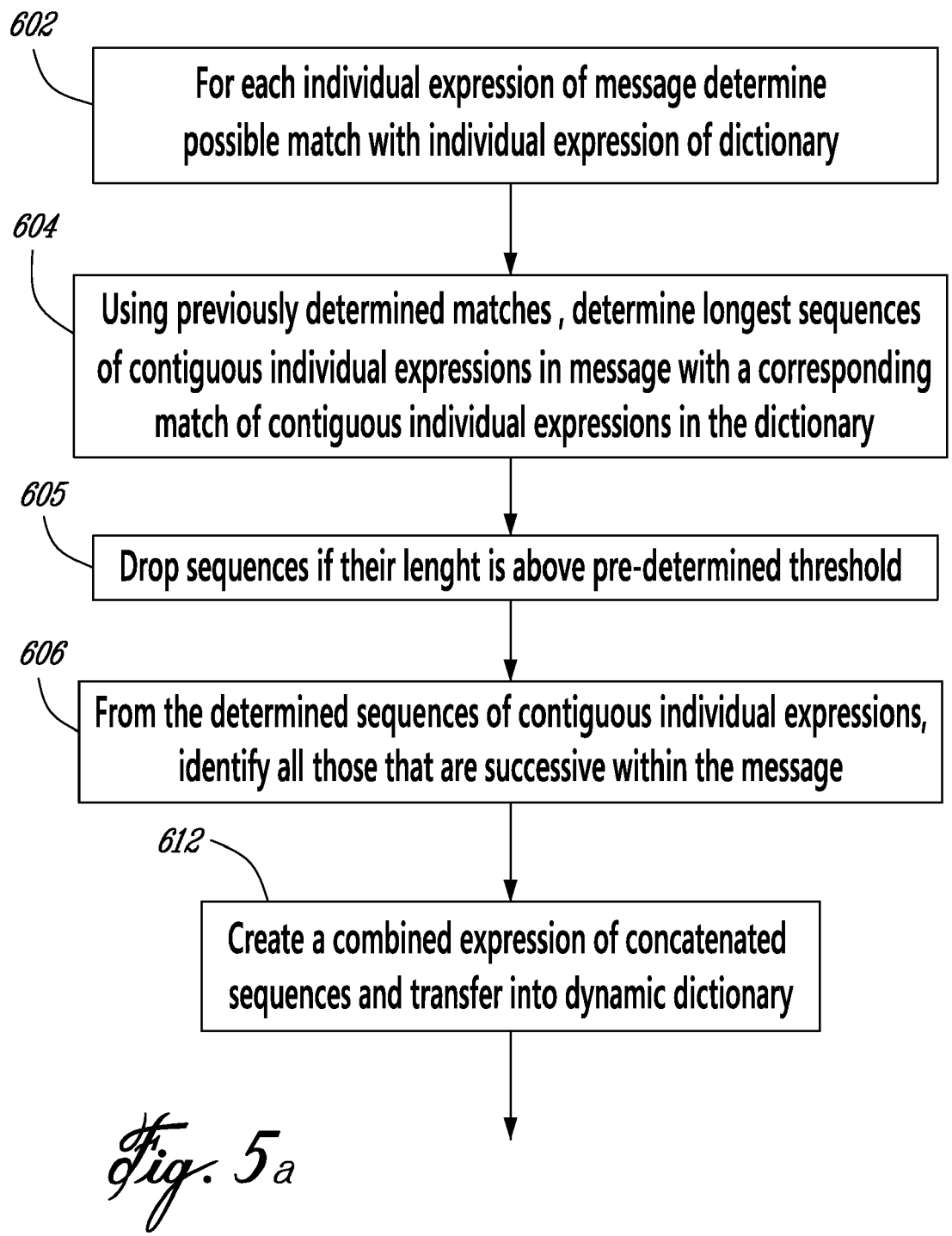

Reference is now made jointly to FIG. 6, previously described, and to FIG. 5, which is an exemplary nodal operation and signal flow diagram representative of a telecommunications network 500 implementing the preferred embodiment of the present invention. Shown in FIG. 5 is first, the node 600 which for exemplary purposes is assumed to be a terminal 510. The later comprises a client application module 512, such as for example a SIP client application module 512 capable of establishing, managing and terminating SIP communications on behalf of terminal 510, and a compression/decompression module 514 (e.g. a SigComp module), responsible for compression and decompression of messages on behalf of the client application module 512. For illustrative purposes, the following exemplary scenario will be explained with reference to a SIP dictionary and SIP compression, although it is to be understood that the invention is not limited to compression and decompression of SIP messages, but may well be used with any other type of text-based protocol, such as for example HTTP. The terminal 510 comprises a dictionary 400 containing a static SIP dictionary 402 and a dynamic SIP dictionary 404 which contain expressions for use in compression and decompression of SIP messages, and which are stored in the memory 603. The later may be any type of memory, such as for example a hard-disk drive, a RAM, etc. The dynamic SIP dictionary 404 may be initially (i.e. at the beginning of a new SIP session or alternatively at the power-up of the terminal 510, depending upon the implementation) empty, although it may comprise content created in a previous session. The expressions contained in the dictionary 400 may comprise individual data bytes, groups of data bytes, or text strings. Typically, the content of either the static dictionary 402 or the dynamic dictionary 404 may have the form of a continuous string, where individual expressions of e.g. one-byte long, or more, are not necessarily delimited though a border or a limit. The terminal 510 communicates via appropriate communication interfaces and links (which may include one or more of a base station, base station controller, air interface, packet switching and control nodes) with a P-CSCF functionality 520 responsible for providing network access and service support for the terminal 510. The P-CSCF functionality 520 also comprises a compression/decompression module 522 (e.g. a SigComp module) and a copy of the same dictionary 400 that contains the static SIP dictionary 402 and the dynamic SIP dictionary 404, which is to be used for compression and decompression of messages exchanged with terminal 510. Finally, the P-CSCF 520 comprises a P-CSCF engine 524 acting as a proxy on behalf of the user accessing the IMS (IP Multimedia Subsystem) domain. One of its primary roles includes controlling QoS for the user and providing secure access to the IMS domain. The P-CSCF 524 is connected to an IMS network (not shown), which connects to the Internet, and/or possibly to other networks.

For simplicity and exemplary purposes, the following exemplary scenario will be described with reference to SigComp compression for SIP, although other types of text-based compression can also be utilized in combination with other protocols based on the teachings of the present invention. Therefore, the compression/decompression modules 514 and 522 are hereinafter referenced as SigComp modules.

In FIG. 5, first, in action 525, the SIP client module 512 is launched on the terminal 510. Such action may comprise the power-on of the terminal 510, the start of the client module 512, or alternatively any other triggering of the client 512. First, the SIP client module registers with the IMS network, and for this purpose, issues a SIP REGISTER message 526. When SIP compression is active on the terminal 510 (as it is assumed to be for the sake of the description of the invention), meaning that outgoing SIP messages originated by the SIP client module 512 are to be compressed before being sent, the message 526 is sent to the SigComp module 514, which acts to compress the message. As the message 526 is a registration message, which is the first message issued by the terminal 510 after initial power-up, such compression may be performed either solely based on the static SIP dictionary 402 if the dynamic dictionary 404 is initially empty, or based on both the static dictionary 402 and the dynamic dictionary 404 in other implementations where the dynamic dictionary 404 may not be empty at the beginning of a new session or at terminal power-up. The SigComp module 514 may compress the message 526, and then act to further send the compressed SIP REGISTER message to the P-CSCF 520 along with a byte code 528. The later includes instructions for compressing and decompressing messages using dictionary-based compression and decompression techniques for SigComp (in the present example), and is sent only once with the first message from the SigComp module 514 to the P-CSCF 520 in a given session (or if there is a system restart due, for example, to a system failure), action 527. The SigComp module 522 of the P-CSCF 520 decompresses the message 526 using the byte code 528 and its own identical copy of the dictionary 402 (action not shown), and then relays the decompressed message 526 to the IMS core network (e.g. to the P-CSCF engine 524 or to another CSCF or node) where the decompressed message is authorized and authenticated as known in the art. Upon successful authorization and registration of the terminal, the IMS core network responds back with a 200 OK message 529, which is received and compressed by the SigComp module 522 of the P-CSCF 520 using the same dictionary as before. The compressed 200 OK message is received by the SigComp module 514 of the terminal 510, action 533, and decompressed, so that the decompressed 200 OK message 529 can be relayed in action 530 to the client 512, for confirming the successful registration with the network.

At this point, the SIP client 512 of the terminal 510 is properly registered with the network, and SigComp compression can further take place when the SIP client 512 communicates with the P-CSCF 520 over the air interface. Furthermore, according to the preferred embodiment of the present invention, when actual traffic takes place, a new, dynamic part of the dictionary 400 is further built, in order to provide for additional and longer dictionary string expressions that could further improve the efficiency of the compression. This part is a new content of the dynamic dictionary 404.

For example, in action 531, the SIP client 512 issues a SIP message intended for the P-CSCF 520. The message 531 may be any type of SIP message such as for example a SIP INVITE message for the establishment of a new SIP session on behalf of the SIP client 512, which is part of an actual traffic initiated by the SIP client 512 in order to communicate with another terminal or server. In action 532, the message 531 is received by the SigComp module 514 of the terminal 510 in order to be compressed before being sent over the air interface. Furthermore, according to the preferred embodiment of the present invention, upon receipt of message 531, the SigComp module 514 attempts to build, or populate, the dynamic dictionary 404, using at least parts of the message 531, so that compressions of subsequent messages can be performed based on expressions obtained from actual traffic messages, or parts thereof.

Figure 7:
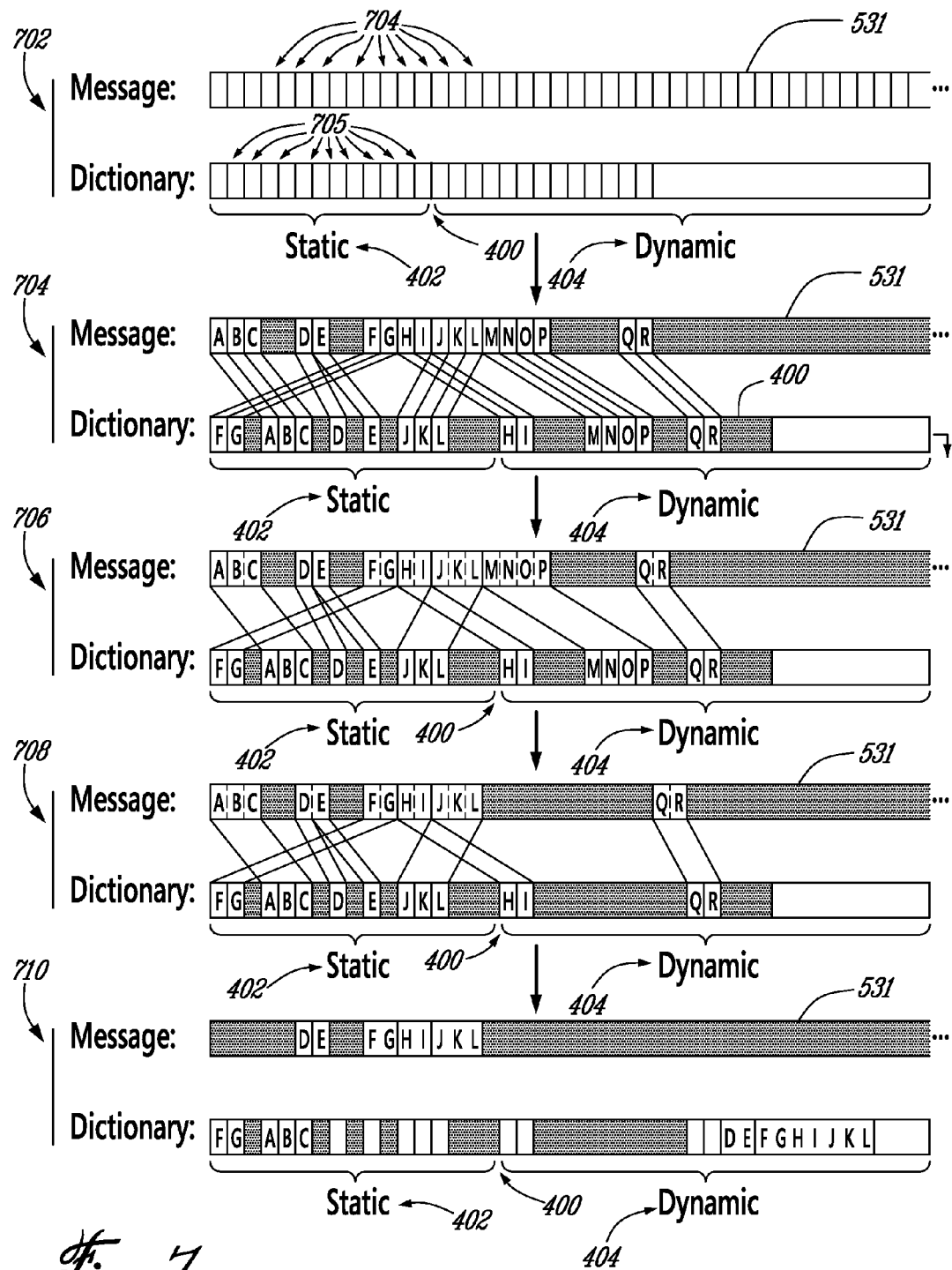
FIG. 7 is exemplary state diagram representative of operations made using the dictionary and a message that is to be compressed in accordance with the method of FIG. 5.*a*.

Reference is now made jointly to FIG. 5, previously described, and to FIGS. 5.a and 7. FIG. 5.a shows an exemplary flowchart diagram which is a continuation of FIG. 5 following action 532, and which represents steps associated with the method of the present invention for updating the dynamic dictionary. FIG. 7 shows an exemplary state diagram representative of operations made using the dictionary 400 and a message like the message 531 which is to be used for creating additional content for the dynamic dictionary 404 in accordance with the method of FIG. 5.a. Thus, after the message 531 is received in action 532 by the SigComp module 514, the later starts operations according to the preferred embodiment of the invention as shown in relation to FIGS. 5.a and 7. FIG. 7 shows at state 702 the message 531 received by the SigComp module as a suite of expressions (e.g. data bytes, strings, etc) $E_i$ 704, and the dictionary 400, which also comprises expressions $E_j$ 705. As mentioned, the dictionary 400 comprises a static dictionary 402 comprising expressions determined before the beginning of the current data session, and a dynamic dictionary 404 that may be empty, or alternatively may contain some expressions as well, but which content is updated during the current data session. In action 602 of FIG. 5.a, the SigComp module 514 attempts to determine matches between each individual expression of the message 531 and individual expressions of the dictionary 400. In FIG. 7, the state 704 shows the matches so determined, wherein each letter A through R identifies an individual expression determined to be present both within the message 531 and the dictionary 400, while the hatched parts indicate portions of the message with no matches in the dictionary. Thus the following individual expressions from the message are determined to have a match in the dictionary, although such match may be found at various dictionary locations, as shown:

A, B, C, D, E, F, G, H, I, J, K, L, M, N, O, P, Q, and R

In action 604 of FIG. 6, the SigComp module 514 uses the matching individual expressions previously found (A to R), to determine longest possible sequences of contiguous individual expressions within the message 531 which have a corresponding match of contiguous individual expressions in the dictionary 400. Action 604 may comprise determining longest sequences of two or more contiguous individual expressions within the message, and then matching such sequences with their correspondent within the dictionary 400. For example, the following individual expressions are contiguous to each other both within the message 531 and the dictionary 400, and are thus determined in action 604 as longest sequences of matching contiguous individual expressions:

| # | Individual Expressions | Matching Longest Sequence of Contiguous Individual Expressions (Message & Dictionary) |
|---|---|---|
| 1 | A, B, and C | ABC |
| 2 | D | D |
| 3 | E | E |
| 4 | F and G | FG |
| 5 | H and I | HI |
| 6 | J, K, and L | JKL |
| 7 | M, N, O, and P | MNOP |
| 8 | Q and R | QR |

State 706 of FIG. 7 shows that message sequences ABC, D, E, FG, HI, JKL, MNOP and QR have matches in the dictionary 400. With respect particularly to the sequences D and E, they are constituted of one single individual expression, because neither D nor E are contiguous to any other individual expression. Thus, in their cases, the determined longest sequence of contiguous individual expressions with matches in both the message and the dictionary is the individual expression itself.

The method may continue with the optional action 605, which includes the discarding of sequences whose length is greater than a pre-defined threshold. For example, it is assumed in the present example that a pre-defined threshold is used T=4 individual expressions, and the test used in action 605 is Length(Sequence)<T and thus, among all the identified sequences, the sequence MNOP is discarded as its length equals 4 individual expressions, and thus it does not satisfy the test. The state 708 of FIG. 7 shows the identified sequences, except for the sequence MNOP which is discarded, assuming that the optional step 605 has been actually performed.

In action 606 of FIG. 5.a, the SigComp module 514 determines, from all the previously identified matching sequences of contiguous individual expressions, all those that are successive (contiguous) within the message 531, i.e. determines any group of two or more successive sequences. As a result of action 606, sequences D and E are identified as being successive (contiguous) in the message, just as are sequences FG, HI, and JKL. Sequences ABC and QR are discarded as they are not successive to any other sequence, and thus cannot constitute a group of two or more successive sequences. Further in action 612, the SigComp module 514 creates the combined expressions comprising successive the sequences DE one side, and FGHIJKL on the other side, by concatenating the respective sequences D and E on one side, and FG, HI, and JKL on the other side, thus creating two (2) combined expressions: DE and FGHIJKL. The SigComp module 514 further transfers the so-created combined expressions into the dynamic dictionary 404. Action 612 thus creates longer expressions constituted by the newly transferred groups of sequences in the dynamic dictionary 404 that can be used more efficiently for subsequent messages compression and decompression. State 710 of FIG. 7 illustrates the newly created combined expressions DE and FGHJKL and their transfer into the dynamic dictionary 404.

Reference is now made back to FIG. 5, where further in action 544, the message 531 is compressed by the SigComp module 514 using both the static dictionary 402 and/or the dynamic dictionary 404, except for the newly transferred groups of sequences, which cannot be used as they are not yet present in the copy of the dynamic dictionary 404 of the P-CSCF 520, which prevents the later of properly decompressing a message compressed using these groups of sequences. However, the message M1 531 can be compressed using any other individual expressions contained in the dictionary 400, whose individual index can be inserted at the respective locations in the compressed message replacing the expressions themselves.

In action 546, the compressed message is sent to the SigComp module 522 of the P-CSCF 520, which then initiates the decompression process, action 548, using its own copies of the static and dynamic dictionary 402 and 404, which results in the decompressed message M1. Finally, the decompressed message M1 is sent from the SigComp module 522 to the P-CSCF engine 524, action 550, from where it is relayed to its destination.

In action 549, which may be performed interchangeably before or after action 548 and/or action 550, the SigComp module 522 builds its own copy of the dynamic dictionary using the message M1. For this purpose, as the receiving SigComp module 522 needs an exact copy of the dictionary 400 in order to be able to properly perform decompression, it must first perform actions analogous to those performed by the sending SigComp module 514 to create the same expressions found in the dynamic dictionary 404 of the sending side 510. Thus, in action 549, the SigComp module 522 performs actions similar to those described in relation to actions 602-612 of FIG. 5.*a*, in combination to FIG. 7, except for the fact that they are performed by the SigComp module 522 instead of the SigComp module 514. As a result of action 549 where the receiving side, i.e. the P-CSCF populates its own copy of the dynamic dictionary 404 with the same combined expressions contained in the dictionary 404 of the sending side, i.e. expressions DE and FGHIJKL, so that both sides have identical copies of the dictionary 400, and thus can use the newly added expressions for performing compression and decompression in their communication with each other.

All subsequent real traffic message exchanged between the SIP client 512 and the P-CSCF 520 may be used by the respective SigComp modules 514 and 522 to create expressions for the dynamic dictionary 404, as described hereinbefore. Furthermore, those skilled in the art would readily recognize that the invention encompasses also actions alike those described in FIGS. 5.*a* and 7 but which can also be performed in a compression/decompression module 522 at the P-CSCF side using messages not only received from the node 510/600, but also based on messages destined to the node 510/600. Likewise, the compression/decompression module 514 of the node 510/600 can also perform actions of FIGS. 5.1 and 7 not only based on messages originated by the node 510/600, but also based on messages received from another node.

Therefore, with the present invention it becomes possible to use real traffic messages in order to continuously attempt the creation of new dictionary expressions longer than the ones already present in the dictionary, in order to render the subsequent message compression and decompression more efficient.

Based upon the foregoing, it should now be apparent to those of ordinary skills in the art that the present invention provides an advantageous and improved scheme for allowing better dictionary-based compression and decompression by creating longer expressions to be used for compression and decompression, based on actual, real-traffic messages, that are likely to be repeated in subsequent messages. Although the system and method of the present invention have been described in particular reference to SIP and SigComp, those skilled in the art would readily appreciate that the present invention can be used with any type of text-based signaling protocol and compression scheme. It should be realized upon reference hereto that the innovative teachings contained herein are not necessarily limited thereto and may be implemented advantageously with any applicable text-based protocol, such as for example the Session Description Protocol (SDP) or the HyperText Transfer Protocol (HTTP), and further with any compression protocol. It is believed that the operation and construction of the present invention will be apparent from the foregoing description. While the method and system shown and described have been characterized as being preferred, it will be readily apparent that various changes and modifications could be made therein without departing from the scope of the invention as defined by the claims set forth hereinbelow.

Although several preferred embodiments of the method and system of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. A method for updating a dynamic dictionary for use in compressions and decompressions of messages, the method comprising the steps of:
   a. receiving at a compression/decompression module in a networking node a message containing individual expressions;
   b. determining at the compression/decompression module all matches between the individual expressions of the message and corresponding expressions in a first dictionary stored in a memory;
   c. among the determined matches of individual expressions, determining different sequences of matches of individual expressions which are contiguous to each other in the message, each of the different matching sequences including one or more contiguous individual expressions and the different sequences which are determined to be contiguous to each other forming at least one new combined expression; and
   d. creating in the dynamic dictionary the at least one new combined expression for exclusive use by the compression/decompression module.

2. The method claimed in claim 1, wherein forming the at least one new combined expression comprises concatenating two or more matching sequences determined to be contiguous to each other within the message; and wherein creating in the dynamic dictionary the at least one new combined expression comprises transferring in the dynamic dictionary the two or more matching sequences determined to be contiguous to each other within the message.

3. The method claimed in claim 1, wherein the different matching sequences comprise one or more text-based expressions.

4. The method claimed in claim 3, wherein each text-based expression comprises a data byte.

5. The method claimed in claim 1, wherein step b. further comprises the step of:
   b.3 dropping matching sequences whose length is more than a pre-defined threshold.

6. The method claimed in claim 1, wherein the method is performed by a compression module at a sending node.

7. The method claimed in claim 1, wherein the method is performed by a decompression module at a receiving node.

8. The method claimed in claim 1, wherein the first dictionary comprises a static dictionary and the dynamic dictionary.

9. The method claimed in claim 1, wherein the message is a text-based protocol message.

10. The method claimed in claim 9, wherein the text-based protocol message is a Session Initiation Protocol (SIP) message.

11. The method claimed in claim 1, wherein steps b., c., and d., are performed by a compression/decompression module of a communications node.

12. The method claimed in claim 11, wherein the compression/decompression module is a SigComp (Signalling Compression) module.

13. A communications node comprising:
- a first dictionary containing string expressions for use in message compression and decompression;
- a dynamic dictionary that stores expressions for use in the message compression and decompression for exclusive use in the communications node; and
- a compression/decompression module that receives a message containing individual expressions, the compression/decompression module further determining all matches between the individual expressions of the message and corresponding expressions in the first dictionary, and yet further, among the determined matches of individual expressions, determining different sequences of matches of individual expressions which are contiguous to each other in the message, each of the different matching sequences including one or more contiguous individual expressions and the different sequences which are determined to be contiguous to each other forming at least one new combined expression, and that creates in the dynamic dictionary the at least one new combined expression.

14. The communications node claimed in claim 13, wherein the compression/decompression module concatenates two or more matching sequences determined to be contiguous to each other within the message, and to transfer in the dynamic dictionary the two or more matching sequences determined to be contiguous to each other within the message.

15. The communications node claimed in claim 13, wherein the matching sequences comprise one or more text-based expressions.

16. The communications node claimed in claim 15, wherein each text-based expression comprises a data byte.

17. The communications node claimed in claim 13, wherein the compression/decompression module further drops matching sequences whose length is more than a predefined threshold.

18. The communications node claimed in claim 13, wherein the communications node is a sending node and the compression/decompression module is a compression module.

19. The communications node claimed in claim 13, wherein the communications node is a receiving node, and the compression/decompression module is a decompression module.

20. The communications node claimed in claim 13, wherein the first dictionary comprises a static dictionary and the dynamic dictionary.

21. The communications node claimed in claim 13, wherein the message is a text-based protocol message.

22. The communications node claimed in claim 21, wherein the text-based protocol message is a Session Initiation Protocol (SIP) message.

23. The communications node claimed in claim 13, wherein the compression/decompression module is a SigComp (Signalling Compression) module.

24. The communications node claimed in claim 13, further comprising:
- a client module that issues the message, the compression/decompression module receiving the message from the client module.

* * * * *

UNITED STATES PATENT AND TRADEMARK OFFICE
CERTIFICATE OF CORRECTION

| | | |
|---|---|---|
| PATENT NO. | : 7,817,630 B2 | Page 1 of 1 |
| APPLICATION NO. | : 11/611980 | |
| DATED | : October 19, 2010 | |
| INVENTOR(S) | : Foti | |

It is certified that error appears in the above-identified patent and that said Letters Patent is hereby corrected as shown below:

In Column 7, Line 5, delete "5.a" and insert -- 5a --, therefor at each occurrence throughout the specification.

In Column 12, Line 61, delete "FGHJKL" and insert -- FGHIJKL --, therefor.

In Column 13, Line 50, delete "5.1" and insert -- 5a --, therefor.

In Column 14, Line 29, in Claim 1, delete "receiving" and insert -- receiving, --, therefor.

In Column 14, Line 30, in Claim 1, delete "node" and insert -- node, --, therefor.

In Column 14, Line 32, in Claim 1, delete "determining" and insert -- determining, --, therefor.

In Column 14, Line 32, in Claim 1, delete "module" and insert -- module, --, therefor.

In Column 14, line 62, in Claim 5, delete "b.3" and insert -- b. --, therefor.

Signed and Sealed this
Eighth Day of November, 2011

David J. Kappos
*Director of the United States Patent and Trademark Office*